United States Patent
Brooks et al.

(10) Patent No.: US 6,473,326 B2
(45) Date of Patent: Oct. 29, 2002

(54) MEMORY STRUCTURES HAVING SELECTIVELY DISABLED PORTIONS FOR POWER CONSERVATION

(75) Inventors: David M. Brooks, Princeton, NJ (US); Vivek Tiwari, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/884,055

(22) Filed: Jun. 20, 2001

(65) Prior Publication Data

US 2001/0033521 A1 Oct. 25, 2001

Related U.S. Application Data

(63) Continuation of application No. 09/459,904, filed on Dec. 14, 1999, now Pat. No. 6,298,002.

(51) Int. Cl.[7] .................................................. G11C 19/00
(52) U.S. Cl. ........................ 365/78; 365/227; 365/229; 365/240
(58) Field of Search ................................ 365/78, 189.01, 365/189.04, 189.05, 189.12, 227, 228, 229, 235, 238.5, 230.03

(56) References Cited

U.S. PATENT DOCUMENTS

| | | | | |
|---|---|---|---|---|
| 3,753,234 A | * | 8/1973 | Gilbert et al. ............ | 340/172.5 |
| 4,293,907 A | * | 10/1981 | Huang et al. ................ | 712/208 |
| 5,475,649 A | * | 12/1995 | Balistreri et al. ....... | 365/230.02 |
| 5,568,416 A | * | 10/1996 | Kawana et al. ................ | 365/49 |
| 5,752,183 A | * | 5/1998 | Mueller et al. ............. | 455/343 |
| 5,802,583 A | * | 9/1998 | Yeager et al. ................ | 711/152 |
| 5,917,771 A | * | 6/1999 | Hill ........................ | 365/230.03 |
| 6,021,129 A | * | 2/2000 | Martin et al. ................ | 370/395 |
| 6,167,484 A | * | 12/2000 | Boyer et al. ................. | 711/106 |
| 6,173,379 B1 | * | 1/2001 | Poplingher et al. ......... | 711/165 |
| 6,215,694 B1 | * | 4/2001 | Li et al. ..................... | 365/156 |
| 6,219,456 B1 | * | 4/2001 | Kasamizugami ............. | 711/127 |
| 6,298,002 B1 | * | 10/2001 | Brooks et al. .............. | 365/227 |

OTHER PUBLICATIONS

Brooks et al, "Dynamically Exploiting Narrow Width Operands to Improve Processor Power and Performance", Proceedings, Fifth International Symposium on High–Performance Computer Architecture, Jan. 9–13, 1999, Orlando, Florida, IEEE Computer Society, Los Alamitos, California.

* cited by examiner

Primary Examiner—Huan Hoang
Assistant Examiner—Gene N. Auduong
(74) Attorney, Agent, or Firm—Kenyon & Kenyon

(57) ABSTRACT

An architecture for registers and/or memory may provide a selectively disable payload portion. The architecture induced energy conservation. The architecture may include two or more payload portions for storage of payload data and a portion for storage of administrative data. Based on the contacts of the administrative data, certain payload portions may be enabled or disabled.

18 Claims, 4 Drawing Sheets

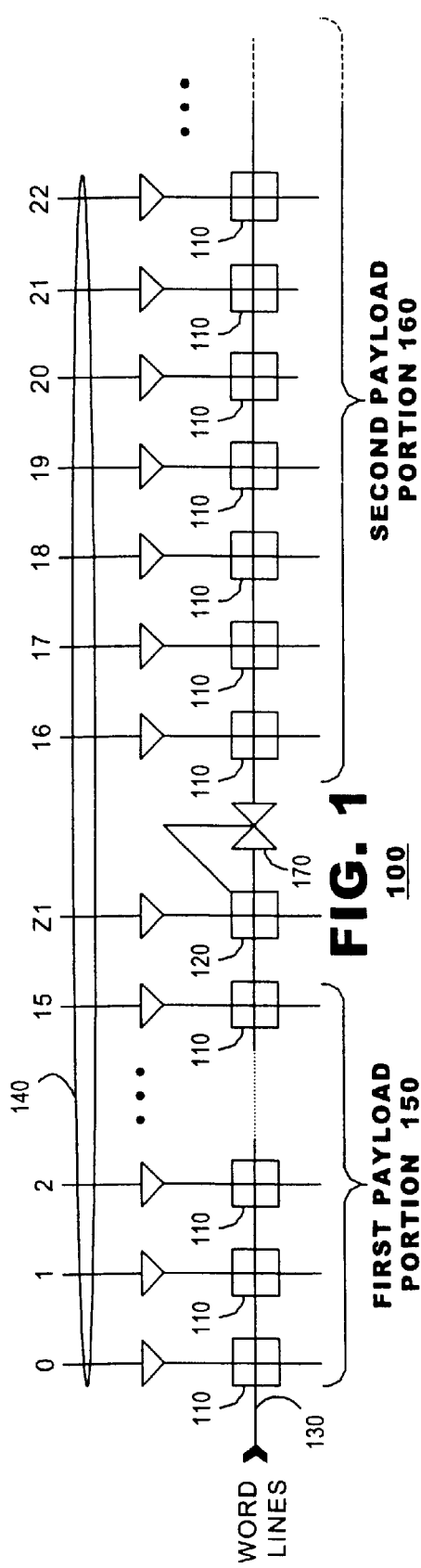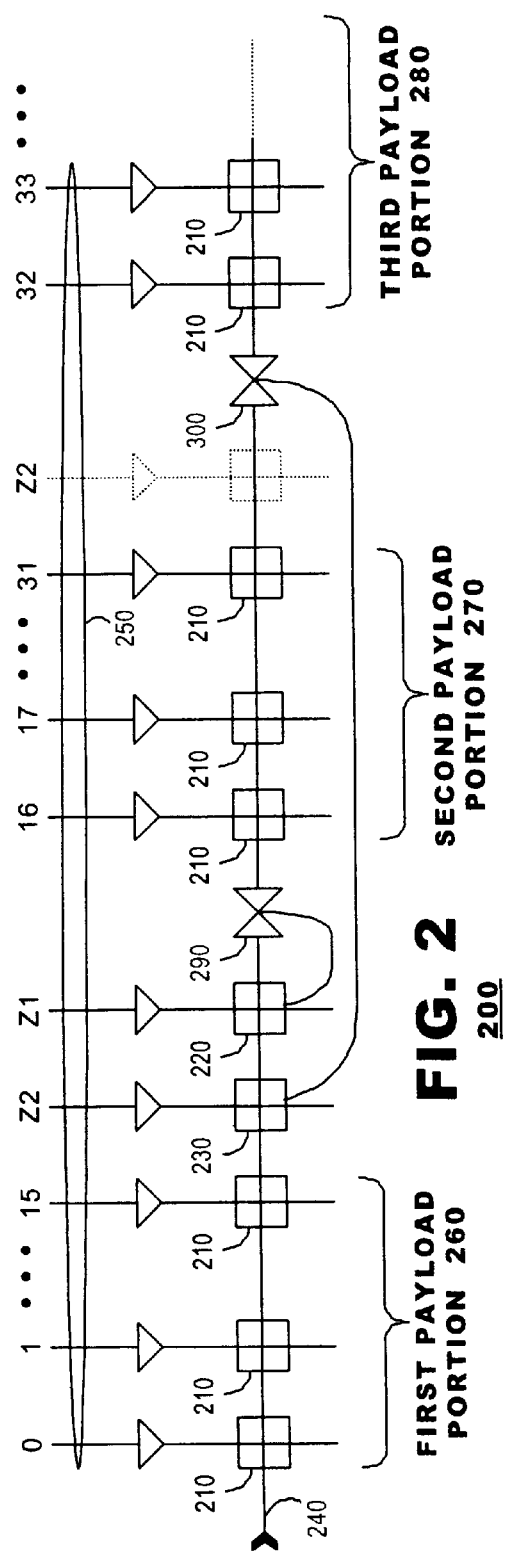

400

900

500

700

MEMORY STRUCTURES HAVING SELECTIVELY DISABLED PORTIONS FOR POWER CONSERVATION

CROSS-REFERENCE TO RELATED PATENT APPLICATION

This patent application is a continuation U.S. application Ser. No. 09/459,904, filed Dec. 14, 1999, now U.S. Pat. No. 6,298,002 and entitled "MEMORY STRUCTURES HAVING SELECTIVELY DISABLED PORTIONS FOR POWER CONSERVATION".

BACKGROUND OF THE INVENTION

The present invention relates to an architecture for registers or memory that contributes to reduced power consumption of integrated circuits. More particularly, the register architecture permits for disabling of selective portions of a register in the presence of narrow width data.

Issues of power consumption have become increasingly important for the design of integrated circuits. The power consumption of integrated circuits, particularly that of processors, has increased over the years with the historical increase clock speeds. Modern processors now consume so much power that the heat generated by the processors has become destructive. The increase in power consumption also contributes to reduced battery life in mobile computing applications.

Power management techniques are commonplace in the modern computer. Users of domestic personal computers recognize that computer monitors, disk drives and the like are disabled when not in use. However, such techniques are not able to keep pace with the ever increasing power demands made by newer generations of integrated circuits. Accordingly, there remains a need in the art for an integrated circuit architecture that contributes to reduced power consumption of the integrated circuit.

SUMMARY OF THE INVENTION

Embodiments of the present invention provide a register having a plurality of payload portions, some of them being selectively disabled.

BRIEF DESCRIPTION OF THE DRAWINGS

FIG. 1 is a block diagram of a register according to an embodiment of the present invention.

FIG. 2 is a block diagram of a register according to another embodiment of the present invention.

DETAILED DESCRIPTION

Figure 3:
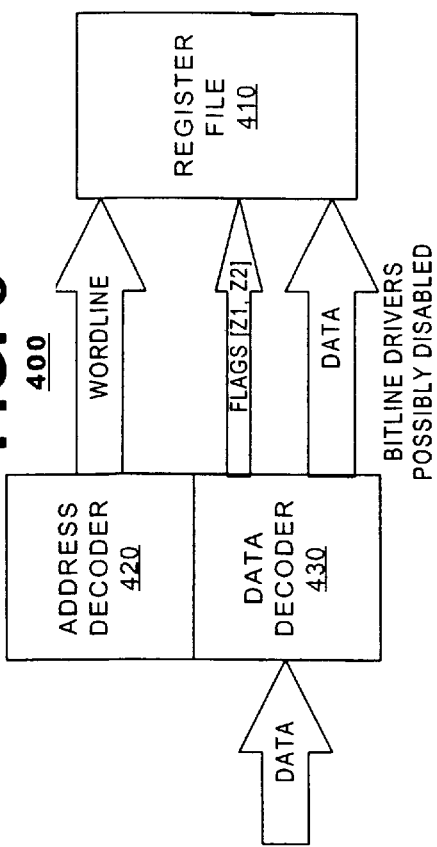
FIG. 3 illustrates a data input system according to an embodiment of the present invention.

Embodiments of the present invention provide a register that selectively disables unused portions when storing data. These embodiments capitalize upon a realization that, for a register having a predetermined width, data stored in the register does not always occupy its full width. When narrow-width data occupies only a first portion of a register, the remaining portion of the register may be disabled. Such an embodiment contributes to reduced power consumption because unused portions of the register are not energized.

FIG. 1 illustrates a register 100 according to an embodiment of the present invention. The register 100 may be populated by a plurality of single bit storage elements 110, 120 (herein, "cells"). The cells 110, 120 store data for each bit position in the register 100. All cells 110, 120 of the register are addressed by wordline 130; individual cells are indexed by respective bitlines 140.

The register 100 shown in FIG. 1 shares many characteristics of known registers. Data is written to or read from the register 100 when an activation signal is applied to the register's respective wordline 130. In a conventional register, the activation signal activates all cells of the register. To write data into a conventional register, electrical signals are driven onto the bitlines 140 corresponding to the data. To read data from a conventional register, no external signals are driven on the bitlines during the activation signal; instead, circuitry within the cells themselves cause electrical data signals to be driven on output terminals of the bitlines. Active portions of the register 100 may operate according to these conventional techniques. The cells 110, 120 may be constructed according to designs that are known in the art.

The register 100 is shown populated by one cell 110 for each bit position of payload data to be stored by the register 100 and additional cells 120 for each bit position of administrative data to be stored by the register 100. As used herein, "payload data" generally refers to user data —data that may constitute executable instructions or variable data to be processed by the instructions. By contrast, "administrative data" refers to data that will be used for power control according to the embodiments described herein. As is described below, however, the administrative data may be related to payload data. In certain embodiments, payload data may be reconstructed from the administrative data. "Payload cells" refers to cells 110 that store payload data; "admin cells" refers to cells 120 that store administrative data.

According to an embodiment of the present invention, the register 100 may include multiple payload portions 150, 160 each populated by a plurality of contiguous payload cells 110 along the wordline 130. An admin cell 120 and a transmission gate 170 may be provided on the wordline 130 at a boundary between the two payload portions 150, 160. The transmission gate 170 may be controlled by the state of data stored in the admin cell 120. A first state of an admin cell 120 causes the transmission gate 170 to become conductive. A second state of the admin cell 120 causes the transmission gate 170 to become non-conductive. Thus, depending upon the state of the data in the admin cell 120, signal driven on the wordline 130 may or may not advance past the transmission gate 170 to the second payload portion 160.

According to an embodiment of the present invention, flag identifiers may be stored in the admin cells 120. The flag identifiers represent the state of stored data in payload portions beyond the respective admin cell. In one state, the flag identifier (labeled "$Z_1$" in FIG. 1) indicates that all data in the second payload portion 160 is zero. Active data would be contained only in the first portion 150. In this case, the transmission gate 170 prevents an activation signal from propagating to the second payload 160. Energy is conserved because the circuitry that generates the wordline activation signal is presented with a smaller electrical load. Further, cells in the second payload portion 160 need not be activated.

According to an embodiment of the present invention, a register may be divided into as many payload portions as are desired. FIG. 2 illustrates an embodiment having three payload portions. In FIG. 2, the register 200 is shown populated by a plurality of payload cells 210 and admin cells 220, 230 that are addressed by a wordline 240 and by a respective one of the bitlines 250. Each of the three payload portions 260–280 is populated by a number of payload cells 210. At a boundary between each payload portion, the register 200 may include a transmission gate 290, 300.

According to an embodiment, the register may include one fewer admin cells 220, 230 than there are payload portions in the register 200. Thus, in the example of FIG. 2 where three payload portions are shown, there are two payload cells 220, 230. Each payload cell 220, 230 stores data of a respective flag identifier $Z_1$, $Z_2$ and controls a respective transmission gate 290, 300. The $Z_1$ flag stored in one of the admin cells 220, 230 indicates the state of data in the second and third payload portions 270, 280. If all data in these payload portions are zero, the $Z_1$ flag renders the associated transmission gate 290 non-conductive. Similarly, the $Z_2$ flag stored the other admin cell 230 indicates the state of data in the third payload portion 280 and, if the data therein should be zero, the $Z_2$ flag renders the associated transmission gate 300 non-conductive. Thus, the register of FIG. 2 provides an embodiment in which multiple portions of a register 200 each may be disabled selectively.

As shown in the embodiment of FIG. 2, all admin cells 220, 230 are provided on an input side of the wordline "upstream" of the first transmission gate 290. The principles of the present invention accommodate other embodiments. For example, as shown in phantom in FIG. 2, the admin cell 230 associated with the $Z_2$ flag identifier may be provided next to its associated transmission gate 300 at a boundary between the second and third payload portions 270, 280.

According to an embodiment of the present invention, the register 200 may include as many payload portions as are desired. The number and width of the payload portions within a register 200 typically will be determined by an expectation of data types (and data widths) that will be handled by the integrated circuit during use.

FIG. 3 illustrates a data access system 400 according to an embodiment of the present invention. The data access system 400 may include a register file 410 that is populated by a plurality of registers, such as the registers 100, 200 of FIGS. 1 and 2. The data access system 400 also may include an address decoder 420 and a data decoder 430. The address decoder 420 receives address data that indexes a register and generates an activation signal on a wordline corresponding to the addressed register.

According to an embodiment, the data decoder 430 may receive data from an external data source and may generate the flag identifiers therefrom. The data decoder 430 may perform zero detection upon certain portions of received data that corresponds to the payload portions described above. If the zero detection determines that all data in a payload portion is zero, it generates an active signal on the associated flag identifier. The data decoder 430 also may permit external data in non-zero payload portions to propagate to the register file 410.

Thus, the data decoder 430 integrates the various embodiments of registers with other processing elements in an integrated circuit.

Figure 4:
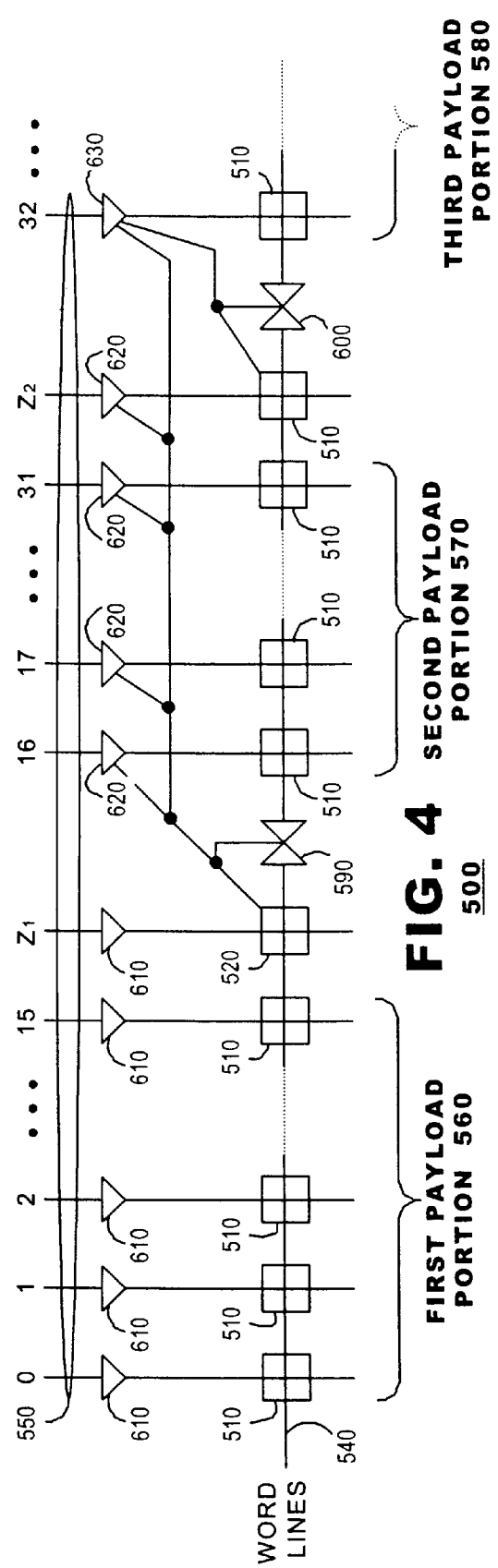
FIG. 4 is a block diagram of a register according to a further embodiment of the present invention.

The principles of the present invention may be extended to achieve even further energy conservation. FIG. 4 illustrates a register 500 constructed according to another embodiment of the present invention. As with the previous embodiments, the register 500 may be populated by payload cells 510 and admin cells 520, 530 provided on a wordline 540. The payload and admin cells 510, 520, 530 each may be addressed by a respective bitline 550. FIG. 4 illustrates an embodiment having three payload portions 560–580. Transmission gates 590 and 600 are provided respectively at boundaries between the payload portions 560–580 and are controlled by respective admin cells 520, 530. In the embodiment shown in FIG. 4, the admin cells 520, 530 are provided on the wordline 540 at the boundaries between the payload portions 560–580 adjacent to the associated transmission gates 590, 600. Accordingly, this embodiment corresponds the alternate embodiment discussed with respect to FIG. 2.

FIG. 4 illustrates drivers 610, 620, 630 associated with each of the bitlines 550. When data is to be written into a register 500, the bitline drivers 610–630 generate electrical signals corresponding to the data. As illustrated in FIG. 4, the flag identifiers stored in each of the admin cells 520, 530 may disable the bitline drivers 620 or 630 associated with successive payload portions 570, 580. Thus, the first admin cell 520 may control the bitline drivers 620, 630 associated with the second and third payload portions 570, 580. The second admin cell 530 may control the bitline drivers 630 associated with the third payload portion 580. This principle may be extended for as many payload portions as are included in the register 500.

The embodiment of FIG. 4 achieves further energy conservation by disabling drivers 620, 630 associated with portions of data that are known to be zero. Disabling the drivers 620, 630 prevents the driver circuits from consuming power and, thus, leads to further energy conservation.

Figure 5:
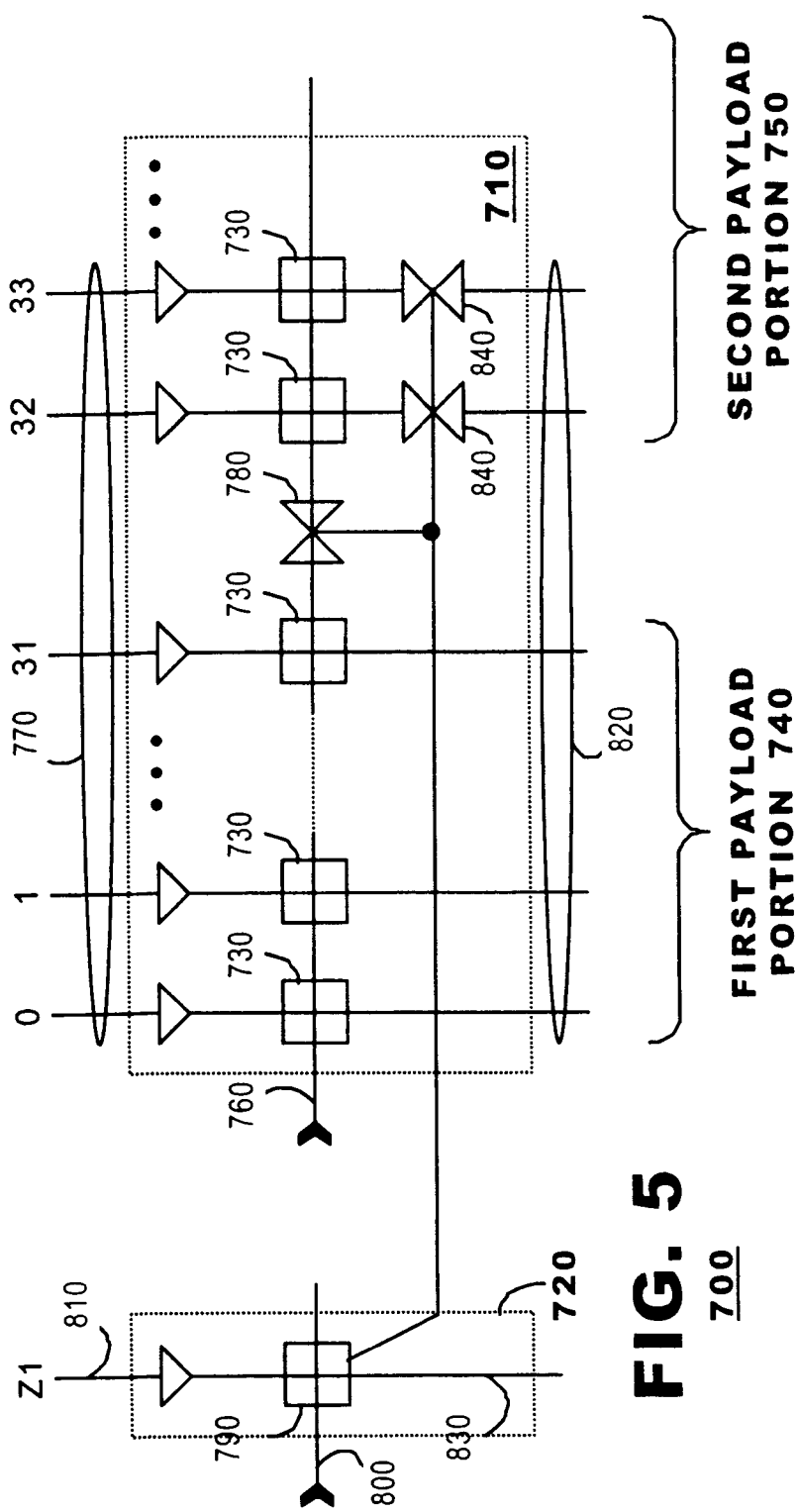
FIG. 5 is a block diagram of a register according to a further embodiment of present invention.

FIG. 5 illustrates another register 700 according to an embodiment of the present invention. Two registers 710 and 720 are illustrated in FIG. 5. A first register 710 is populated by payload cells 730. In the embodiment of FIG. 5, the register 710 includes two payload portions 740, 750. As with the earlier embodiments, the payload cells 730 are provided on a wordline 760. Each payload cell 730 is associated with a bitline (shown collectively as 770). A transmission gate 780 is provided on the wordline 760 at boundary between the two payload portions.

In the embodiment of FIG. 5, admin cells 790 may be provided in the second register 720. The admin cells 790 may be provided on a second wordline 800. Each admin cell 790 may be associated with a bitline 810. The admin cells 790 may be electrically coupled to the transmission gate 780 to render the transmission gate 780 selectively conductive or non-conductive.

FIG. 5 illustrates output bitlines 820, 830 for the cells 730, 790 of the first and second registers 710, 720. The output bitlines 820, 830 may carry data from the cells 730, 790 when data is to be read from the registers 710, 720.

According to an embodiment of the invention, transmission gates 840 may be provided on the output bitlines associated with the second payload portion 750. The transmission gates 840 may be controlled by the admin cell 790. Thus, for narrow width data, the transmission gates 840 may be rendered non-conductive, which would prevent any spurious signal generated by payload cells 730 within the second payload portion 750 from reaching a data receiver.

Figure 6:
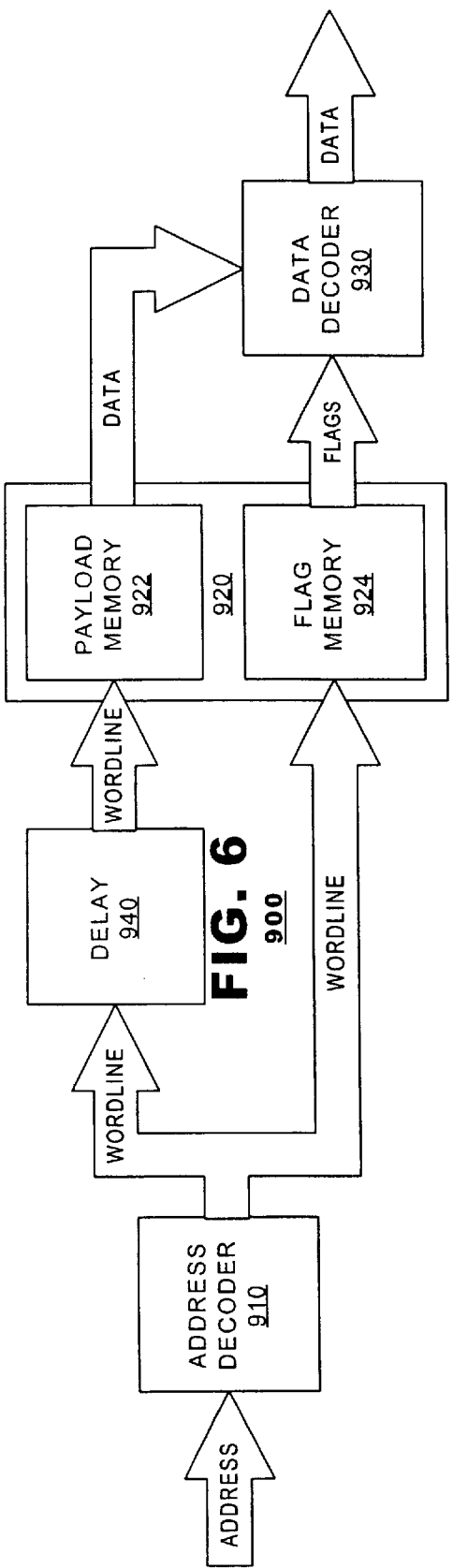
FIG. 6 illustrates a data output system according to an embodiment of the present invention.

FIG. 6 illustrates a system 900 for implementing reads of data from a register according to an embodiment of the present invention. As shown in FIG. 6, this embodiment may include an address decoder 910, a file register 920 and a data decoder 930. The register file 920 may include a payload memory 922 and a flag memory 924. The system 900 also may include a delay element 940.

The address decoder 910 may receive an externally supplied address that identifies a register within the register file 920 and generates an activation signal on a wordline corresponding to the addressed register. The activation signal may propagate to the flag memory 924 and to the delay element 940. From the delay element 940, the wordline may propagate to the payload memory 922.

The delay element 940 may impose a slight delay upon the activation signal as it propagates from the address decoder 910 to the payload memory 922. For example, the delay element 940 may impose a half-cycle delay upon the activation signal. In such a case, the activation signal would reach the flag memory 924 one-half a cycle earlier than the time the activation signal would reach the payload memory 922. Thus, the flag signals would be output from the flag memory 924 one-half a cycle earlier than payload data would be output from the payload memory 922. The flag signals and the payload data may be input to the data decoder 930.

The data decoder 930 may generate a full-width data output based upon the flag identifiers and the payload data. The data decoder 930 may ensure that zero signals are output on any data lines that the flag identifiers indicate have zero value regardless of any spurious signals that may be received from the payload memory 922 on such data lines.

According to an embodiment the payload memory 922 may be populated by a plurality of registers such as register 710 (FIG. 5). Further, in an embodiment, the flag memory 924 may be populated by a plurality of registers such as admin registers 720 (FIG. 5).

Accordingly, embodiments are shown that induce energy conservation in registers when those registers store narrow width data. The energy conservation can lead to reduced energy drain for wordline drivers, storage cells, bitline drivers, and bitline receivers.

The preceding discussion describes embodiments of the present invention as applied to registers. The term "register" has been used in its broadest possible sense to refer to memory structures of all kinds. Thus, the registers described herein may be used within processing circuits as buffers, cache memory and registers and also in memory systems.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A register for use in an integrated circuit, comprising a plurality of storage cells, a first portion of the storage cells being selectively disabled while a second portion of the storage cells is enabled, and
means for disabling the first portion when a length of data to be stored in the register fits entirely within the second portion.

2. The register of claim 1 further comprising disabling circuitry coupled to storage cells in the second portion.

3. The register of claim 1, wherein the first portion is disabled based upon a length of a data item stored in the register.

4. The register of claim 1, wherein the two portions are provided along a wordline.

5. The register of claim 1, wherein each storage cell is coupled to respective bit lines, wherein disabling circuitry is provided on each bit line of the first portion of storage cells.

6. The register of claim 1, wherein the means comprises a storage cell to store data representative of a length of the data to be stored.

7. A system comprising:
a data decoder having outputs for data and a flag identifier,
a register file populated by a plurality of registers, at least one register having two payload portions, the second payload portion being selectively disabled in response to the flag identifier.

8. The system of claim 7, wherein:
the two payload portions each comprise respective numbers of storage cells,
the register file further comprises:
an admin storage cell to store the flag identifier, and
a disabling circuit having a control input coupled to the admin storage cell, and
the storage cells of the two payload portions, the admin storage cell and the disabling circuit are provided along a single wordline.

9. The register of claim 8, further comprising:
bitlines coupled to each of the storage cells of the second payload portion, and
disabling circuits provided along the bitlines.

10. A system comprising:
an address decoder,
a delay element coupled to the address decoder,
a register file populated by a payload memory and a flag memory, the flag memory coupled to the address decoder, the payload memory coupled to the delay element, and
a data decoder coupled to the flag memory and the payload memory.

11. A method of storing a data item in a register, the register having a plurality of payload portions each of a respective width, comprising, when a width of a data item does not exceed the width of a first payload portion, storing the data in the first payload portion and disabling a second payload portion.

12. The method of claim 11, further comprising storing a flag identifier in the register indicating a state of data in the second payload portion.

13. The method of claim 11, further comprising disabling bit lines associated with storage cells in the second payload portion.

14. The method of claim 11, further comprising, when the width of the data item does not exceed the combined width of two payload portions, storing the data item in the two payload portions and disabling a third payload portion.

15. The method of claim 11, wherein the disabling is removing power from the second portion of storage cells.

16. A register comprising:
a plurality of storage cells provided along a wordline,
a disabling circuit provided on the wordline interspersed between first and second sets of the storage cells, and
an admin storage cell provided along the wordline and having an output that controls the disabling circuit.

17. The register of claim 16, further comprising:
bitlines coupled to each of the storage cells, and
disabling circuits provided along the bitlines of the second set of storage cells.

18. The register of claim 17, further comprising an admin storage cell provided along the wordline and having an output that controls the disabling circuits provided along the bitlines of the second set of storage cells.

* * * * *